(12) United States Patent
Liu et al.

(10) Patent No.: US 12,132,056 B2
(45) Date of Patent: Oct. 29, 2024

(54) DISPLAY PANEL AND DISPLAY DEVICE (71) Applicant: Shenzhen China Star Optoelectronics Semiconductor Display Technology Co., Ltd., Guangdong (CN)

(72) Inventors: Chaofan Liu, Guangdong (CN); Junzheng Liu, Guangdong (CN); Kecheng Xie, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 564 days.

(21) Appl. No.: 17/437,318

(22) PCT Filed: Jul. 23, 2021

(86) PCT No.: PCT/CN2021/108222
§ 371 (c)(1),
(2) Date: Sep. 8, 2021

(87) PCT Pub. No.: WO2022/222296
PCT Pub. Date: Oct. 27, 2022

(65) Prior Publication Data
US 2023/0187458 A1 Jun. 15, 2023

(30) Foreign Application Priority Data
Apr. 22, 2021 (CN) .......................... 202110436172.3

(51) Int. Cl.
*H01L 27/14* (2006.01)
*H01L 27/12* (2006.01)
*H01L 29/417* (2006.01)

(52) U.S. Cl.
CPC .... *H01L 27/1251* (2013.01); *H01L 29/41733* (2013.01)

(58) Field of Classification Search
CPC ........... H01L 27/1251; H01L 29/41733; H01L 27/124; H01L 27/1248
USPC ...................................................... 257/59, 72
See application file for complete search history.

(56) References Cited

U.S. PATENT DOCUMENTS

| | | |
|---|---|---|
| 9,437,614 B1 | 9/2016 | Lee et al. |
| 2017/0033131 A1 | 2/2017 | Liu et al. |

FOREIGN PATENT DOCUMENTS

| | | | |
|---|---|---|---|
| CN | 1991470 | | 7/2007 |
| CN | 103035636 | | 4/2013 |
| CN | 104142594 | | 11/2014 |
| CN | 105977307 | | 9/2016 |
| CN | 107170834 | | 9/2017 |
| CN | 109064909 | | 12/2018 |
| CN | 110174787 | | 8/2019 |
| CN | 107170834 B | * | 11/2019 |

\* cited by examiner

Primary Examiner — Tan N Tran (57) ABSTRACT

The present application provides a display panel and a display device, the display panel includes a transistor located in a display region, the transistor is at least one of a main transistor, an auxiliary transistor, and a voltage divider transistor. The transistor includes a channel located above a semiconductor layer and a source electrode and a drain electrode located on an electrode layer. The drain electrode includes a drain electrode tip region, and an orthographic projection of the drain electrode tip region on the semiconductor layer is located outside the channel.

16 Claims, 5 Drawing Sheets

DISPLAY PANEL AND DISPLAY DEVICE

RELATED APPLICATIONS

This application is a National Phase of PCT Patent Application No. PCT/CN2021/108222 having International filing date of Jul. 23, 2021, which claims the benefit of priority of Chinese Patent Application No. 202110436172.3 filed on Apr. 22, 2021. The contents of the above applications are all incorporated by reference as if fully set forth herein in their entirety.

FIELD AND BACKGROUND OF THE INVENTION

The present application relates to a field of display technologies, especially to a display panel and a display device.

An issue of groups of bright spots in a thin film transistor liquid crystal display panel seriously affects display quality of the display panel and a user's use experience. Observing where the positions where the dark spot and the bright spot are generated, it is found that the thin film transistor corresponding to a pixel at the bright spot or the dark spot has different degrees of striking through the semiconductor layer, and the striking through position corresponds to a tip region of a drain electrode of the thin film transistor. Combined with the working principle of thin film transistors, it can be seen that when the thin film transistor is turned on, the carrier of the source electrode will gather to the drain electrode through the semiconductor layer, and the tip region of the drain electrode cannot transfer the carrier in time to result in a large amount of electric charges accumulated in the drain electrode tip region to cause corona discharge of the drain electrode, and the semiconductor layer is broken down by the discharge current such that the thin film transistor loses its switching function. A thin film transistor connected to a data line is struck through to result in continuous lighting of a pixel to form a bright spot. Striking through a thin film transistor connected to a common line including a voltage pull down function would leads to the pixel to be constantly dimming to form a dark spot.

SUMMARY OF THE INVENTION

Technical Issue

The conventional display panel has a technical issue that the display panel generates groups of bright spots due to corona discharge of a drain electrode of a thin film transistor striking through a semiconductor layer.

Technical Solution

The present application provides a display panel and a display device for solving a technical issue of groups of bright spots existing in a conventional display panel.

The present application provides a display panel, comprising a transistor in a display region, the transistor comprising at least one of a main transistor, an auxiliary transistor, or a voltage divider transistor, and the transistor comprising a channel located above the semiconductor layer and a source electrode and a drain electrode located on the electrode layer;

wherein the drain electrode comprises a drain electrode tip region, and an orthographic projection of the drain electrode tip region on the semiconductor layer is located outside the channel.

In the display panel of the present application, the source electrode comprises a source electrode tip region, an orthographic projection of the source electrode tip region on the semiconductor layer is located outside the channel.

In the display panel of the present application, the transistor comprises the main transistor, the main transistor comprises a first channel located in the semiconductor layer and a first source electrode and a first drain electrode located on the electrode layer; and the first drain electrode comprises a first drain electrode tip region, and an orthographic projection of the first drain electrode tip region on the semiconductor layer is located outside the first channel.

In the display panel of the present application, the first source electrode comprises a first source electrode tip region, and an orthographic projection of the first source electrode tip region on the semiconductor layer is located outside the first channel.

In the display panel of the present application, the first channel comprises a first aperture, and the orthographic projection of the first drain electrode tip region on the semiconductor layer is located in the first aperture.

In the display panel of the present application, the first channel comprises a second aperture, and the orthographic projection of the first source electrode tip region on the semiconductor layer is located in the second aperture.

In the display panel of the present application, the first aperture is a concave aperture defined above the first channel, or is a fully closed or semi-closed aperture defined above the first channel; and the second aperture is a concave aperture defined above the first channel or, is a fully closed or semi-closed aperture defined above the first channel.

In the display panel of the present application, the transistor comprises the main transistor and the auxiliary transistor, and the auxiliary transistor comprises a second channel located in the semiconductor layer and a second source electrode and a second drain electrode located on the electrode layer; and the second drain electrode comprises a second drain electrode tip region, and an orthographic projection of the second drain electrode tip region on the semiconductor layer is located outside the second channel.

In the display panel of the present application, the second source electrode comprises a second source electrode tip region, and an orthographic projection of the second source electrode tip region on the semiconductor layer is located outside the second channel.

In the display panel of the present application, the second channel comprises a third aperture, the orthographic projection of the second drain electrode tip region on the semiconductor layer is located in the third aperture.

In the display panel of the present application, the second channel comprises a fourth aperture, and the orthographic projection of the second source electrode tip region on the semiconductor layer is located in the fourth aperture.

In the display panel of the present application, the third aperture is a concave aperture defined above the second channel, or is a fully closed or semi-closed aperture defined above the second channel; and the fourth aperture is a concave aperture defined above the second channel, or is a fully closed or semi-closed aperture defined above the second channel.

In the display panel of the present application, the transistor comprises the main transistor, the auxiliary transistor, and the voltage divider transistor, and the voltage divider transistor comprises a third channel located in the semiconductor layer and a third source electrode and a third drain electrode located on the electrode layer; and the third drain electrode comprises a third drain electrode tip region, and an orthographic projection of the third drain electrode tip region on the semiconductor layer is located outside the third channel.

In the display panel of the present application, the third source electrode comprises a third source electrode tip region, and an orthographic projection of the third source electrode tip region on the semiconductor layer is located outside the third channel.

In the display panel of the present application, the third channel comprises a fifth aperture, and an orthographic projection of the third drain electrode tip region on the semiconductor layer is located in the fifth aperture.

In the display panel of the present application, the third channel comprises a sixth aperture, and an orthographic projection of the third source electrode tip region on the semiconductor layer is located in the sixth aperture.

In the display panel of the present application, the fifth aperture is a concave aperture defined above the third channel, or is a fully closed or semi-closed aperture defined above the third channel; and the sixth aperture is a concave aperture defined above the third channel, or is a fully closed or semi-closed aperture defined above the third channel.

In the display panel of the present application, the display panel further comprises a main pixel electrode and an auxiliary pixel electrode, the main transistor is electrically connected to the main pixel electrode, and the auxiliary transistor and the voltage divider transistor are electrically connected to the auxiliary pixel electrode.

The present application also a display panel, comprises a main transistor, an auxiliary transistor, and a voltage divider transistor;

wherein the main transistor comprises a first channel located in a semiconductor layer and a first source electrode and a first drain electrode located on an electrode layer, the first drain electrode comprises a first drain electrode tip region, an orthographic projection of the first drain electrode tip region on the semiconductor layer is located outside the first channel, the first source electrode comprises a first source electrode tip region, and an orthographic projection of the first source electrode tip region on the semiconductor layer is located outside the first channel;

wherein the auxiliary transistor comprises a second channel located in the semiconductor layer and a second source electrode and a second drain electrode located on the electrode layer, the second drain electrode comprises a second drain electrode tip region, an orthographic projection of the second drain electrode tip region on the semiconductor layer is located outside the second channel, the second source electrode comprises a second source electrode tip region, and an orthographic projection of the second source electrode tip region on the semiconductor layer is located outside the second channel; and wherein the voltage divider transistor comprises a third channel located in the semiconductor layer and a third source electrode and a third drain electrode located on the electrode layer, the third drain electrode comprises a third drain electrode tip region, an orthographic projection of the third drain electrode tip region on the semiconductor layer is located outside the third channel, the third source electrode comprises a third source electrode tip region, and an orthographic projection of the third source electrode tip region on the semiconductor layer is located outside the third channel.

The present application also provides a display device comprising the display panel as above.

Advantages

The present application provides a display panel and a display device. The display panel comprises a transistor located in a display region. The transistor is at least one of a main transistor, an auxiliary transistor, and a voltage divider transistor. The transistor comprises a channel located above a semiconductor layer and a source electrode and a drain electrode located above an electrode layer. A drain electrode comprises a drain electrode tip region, and an orthographic projection of the drain electrode tip region on the semiconductor layer is located outside the channel. The present application staggers the drain electrode tip region of the transistor and the channel of the transistor without overlap to eliminate a risk that the channel of the transistor is struck through by electric charges accumulated in the drain electrode tip region of the transistor, which improves reliability of the thin film transistor, which solves the issue of groups of bright spots of the display panel.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

The embodiment of the present application provides a display panel, the display panel comprises a main transistor, an auxiliary transistor, and a voltage divider transistor, the main transistor. At least one of the auxiliary transistor and the voltage divider transistor comprises a channel located above a semiconductor layer and a source electrode and a drain electrode located on an electrode layer. The drain electrode comprises a drain electrode tip region, and an orthographic projection of the drain electrode tip region on the semiconductor layer is located outside the channel. The present embodiment staggers the drain electrode tip region of the transistor and the channel of the transistor without overlap to eliminate a risk that the channel of the transistor is struck through by electric charges accumulated in the drain electrode tip region of the transistor, which improves reliability of the thin film transistor, which solves the issue of groups of bright spots of the display panel.

In the display panel provided by the embodiment of the present application, the source electrode further comprises a source electrode tip region, and an orthographic projection of the source electrode tip region on the semiconductor layer is located outside the channel. The present embodiment staggers the source electrode tip region of the transistor and the channel of the transistor without overlap to eliminate a risk that the channel of the transistor is struck through by electric charges accumulated in the source electrode tip region of the transistor, which further improves reliability of thin film transistor.

Figure 1:
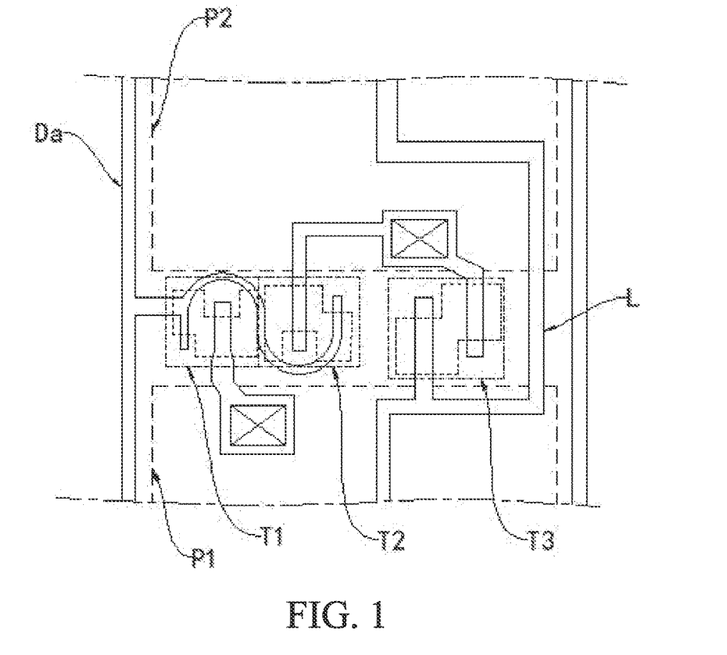
FIG. 1 is a partial perspective view of a first display panel provided by an embodiment of the present application.
Figure 2:
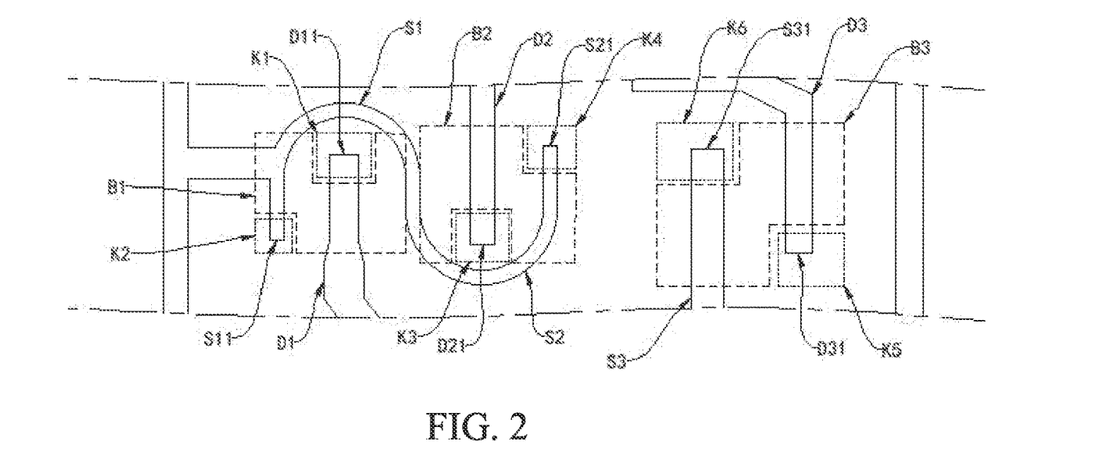
FIG. 2 is a schematic partial view is a schematic partial view of a region of the display panel shown in FIG. 1 in which a transistor is correspondingly located.

With reference to FIGS. 1 and 2, FIG. 1 is a partial perspective view of a first display panel provided by an embodiment of the present application, and FIG. 2 is a schematic partial view is a schematic partial view of a region of the display panel shown in FIG. 1 in which a transistor is correspondingly located. The display panel comprises a driver circuit layer, various lines and electronic components for driving the display panel to display are disposed on the driver circuit layer, for example, data lines for configured to provide data signals, scan lines configured to provide gate electrode driving signals, common lines configured to provide common signals, and a semiconductor layer, source electrodes and drain electrodes constituting thin film transistors. Insulation layers are required to be disposed among various conductive lines.

The display panel further comprises a pixel electrode disposed on the driver circuit layer, and the pixel electrode comprises a main pixel electrode P1 and an auxiliary pixel electrode P2. The display panel comprises a plurality of pixels, and each pixel comprises a main pixel electrode P1 and an auxiliary pixel electrode P2. When the display panel display images, each of the pixels emits light of a color, the main pixel electrode P1 and the auxiliary pixel electrode P2 in the same pixel generate different electrical field effects such that the display panel has a greater viewable angle.

The driver circuit layer comprises a main transistor T1 disposed to correspond to the display region of the display panel, an auxiliary transistor T2, and a voltage divider transistor T3, and the driver circuit layer further comprises a semiconductor layer and an electrode layer.

The main transistor T1 comprises a first channel B1 located on the semiconductor layer and a first source electrode S1 and a first drain electrode D1 located on the electrode layer.

A first end of the first channel B1 is connected to the first drain electrode D1, ad a second end of the first channel B1 is connected to the first source electrode S1. The first end and the second end of the first channel B1 refer to two different doping regions above the first channel B1 respectively, for example, they can refer to a n-type doping region and a p-type doping region above the first channel B1. The first drain electrode D1 is electrically connected to the main pixel electrode P1, and the first source electrode S1 is electrically connected to data line Da. The first channel B1, and the first source electrode S1, and the first drain electrode D1 constitute the main transistor T1, and the main transistor T1 is configured to transmit data signals provided by the data line Da to the main pixel electrode P1 such that the main pixel electrode P1 generates an electrical field. A first aperture K1 is defined above the first channel B1, the first drain electrode D1 comprises a first drain electrode tip region D11, and an orthographic projection of the first drain electrode tip region D11 on the semiconductor layer is located in the first aperture K1. The first aperture K1 can be a concave aperture above the first channel B1, and can be a fully closed or semi-closed aperture defined above the first channel B1. The first drain electrode tip region D11 refers to an end portion region of the first drain electrode D1, and the end portion region is a region formed by the end portion of the first drain electrode D1 extending for a certain distance along the first drain electrode D1.

The present embodiment defines the first aperture K1 above first channel B1 and disposes the first drain electrode tip region D11 to correspond to the first aperture K1 such that the first drain electrode tip region D11 does not overlap with the first channel B1 to eliminate a risk that electric charges are accumulated in the first drain electrode tip region D11 to result in the first channel B1 to be struck through, which improves reliability of the main transistor T1.

Furthermore, a second aperture K2 is defined in the first channel B1, the first source electrode S1 comprises a first source electrode tip region S11, and an orthographic projection of the first source electrode tip region S11 on the semiconductor layer is located in the second aperture K2. The second aperture K2 can be a concave aperture above the first channel B1, and can also be a fully closed or semi-closed aperture defined above the first channel B1. The first source electrode tip region S11 refers to an end portion region of the first source electrode S1, and the end portion region is a region formed by the end portion of the first source electrode S1 extending for a certain distance along the first source electrode S1.

The present embodiment defines the second aperture K2 above first channel B1, and disposes the first source electrode tip region Si1 to correspond to the second aperture K2 such that the first source electrode tip region Si1 does not overlap with first channel B1 to eliminate a risk that the first channel B1 is struck through due to electric charges accumulated in the first source electrode tip region Sit which further improves reliability of the main transistor T1.

Furthermore, the auxiliary transistor T2 comprises a second channel B2 located above the semiconductor layer and a second source electrode S2 and a second drain electrode D2 located on the electrode layer.

A first end of the second channel B2 is connected to the second drain electrode D2, a second end of the second channel B2 is connected to the second source electrode S2. The first end and the second end of the second channel B2 refer to two different doping regions on the second channel B2 respectively, for example, they can refer to a n-type doping region and a p-type doping region on the second channel B2 respectively. The second drain electrode D2 is electrically connected to the auxiliary pixel electrode P2, the second source electrode S2 is electrically connected to data line Da. The second channel B2, the second source electrode S2, and the second drain electrode D2 constitute the auxiliary transistor T2, the auxiliary transistor T2 is configured to transmit data signals provided by the data line Da to the auxiliary pixel electrode P2, such that the auxiliary pixel electrode P2 generate an electrical field.

Optionally, the first source electrode S1 and the second source electrode S2 is electrically connected to, and both are connected to the data line Da.

A third aperture K3 is defined above the second channel B2, the second drain electrode D2 comprises a second drain electrode tip region D21, and an orthographic projection of the second drain electrode tip region D21 on the semiconductor layer is located in the third aperture K3. The third aperture K3 can be a concave aperture above the second channel B2, and can also be a fully closed or semi-closed aperture defined above the second channel B2. The second drain electrode tip region D21 refers to an end portion region of the second drain electrode D2, and the end portion region refers to a region formed by the end portion of the second drain electrode D2 extending for a certain distance along the second drain electrode D2.

The present embodiment defines the third aperture K3 above the second channel B2 and disposes the second drain electrode tip region D21 to correspond to the third aperture K3 such that the second drain electrode tip region D21 dose not overlap with the second channel B2 to eliminate a risk that electric charges accumulated in the second drain electrode tip region D21 results in the second channel B2 struck through, which improves reliability of the auxiliary transistor T2.

Furthermore, a fourth aperture K4 is further defined above the second channel B2, the second source electrode S2 comprises second source electrode tip region S21, an orthographic projection of the second source electrode tip region S21 on the semiconductor layer is located in the fourth aperture K4. The fourth aperture K4 can be a concave aperture above the second channel B2, and can also be a fully closed or semi-closed aperture defined above the second channel B2. The second source electrode tip region S21 refers to an end portion region of the second source electrode S2, and the end portion region refers to a region formed by the end portion of the second source electrode S2 extending for a certain distance along the second source electrode S2.

The present embodiment defines the fourth aperture K4 above the second channel B2 and disposes the second source electrode tip region S21 to correspond to the fourth aperture K4 such that the second source electrode tip region S21 does not overlap with the second channel B2 to eliminate a risk that electric charges accumulated in the second source electrode tip region S21 results in the second channel B2 to be struck through, which further improves reliability of second thin film transistor.

Furthermore, the voltage divider transistor T3 comprises a third channel B3 located above the semiconductor layer and a third source electrode S3 and a third drain electrode D3 located on the electrode layer.

A first end of the third channel B3 is connected to the third drain electrode D3, and a second end of the third channel B3 is connected to the third source electrode S3. The first end and the second end of the third channel B3 refer to two different doping regions of the third channel B3 respectively. For example, they can refer to a n-type doping region and a p-type doping region on the third channel B3 respectively. The third drain electrode D3 is electrically connected to the auxiliary pixel electrode P2, the third source electrode S3 is electrically connected to a common line L. A voltage provided by the common line L is lower than a voltage provided by the data line Da. The third channel B3, the third source electrode S3, and the third drain electrode D3 constitute the voltage divider transistor T3, and the voltage divider transistor T3 is configured to transmit signals provided by the common line L to the auxiliary pixel electrode P2 to lower intensity of an electrical field generated by the auxiliary pixel electrode P2.

A fifth aperture K5 is defined above the third channel B3, the third drain electrode D3 comprises a third drain electrode tip region D31, an orthographic projection of the third drain electrode tip region D31 on the semiconductor layer is located in the fifth aperture K5. The fifth aperture K5 can be a concave aperture above the third channel B3, and can be a fully closed or semi-closed aperture defined above the third channel B3. The third drain electrode tip region D31 refers to an end portion region of the third drain electrode D3, and the end portion region is a region formed by the end portion of the third drain electrode D3 extending for a certain distance along the third drain electrode D3.

The present embodiment defines the fifth aperture K5 above the third channel B3 and disposes the third drain electrode tip region D31 to correspond to the fifth aperture K5 such that third drain electrode tip region D31 does not overlap with the third channel B3 to eliminate a risk that electric charges are accumulated in the third drain electrode tip region D31 to result in the third channel B3 to be struck through, which improves reliability of the voltage divider transistor T3.

Furthermore, a sixth aperture K6 is further defined in the third channel B3, the third source electrode S3 comprises a third source electrode tip region S31, an orthographic projection of the third source electrode tip region S31 on the semiconductor layer is located in the sixth aperture K6. The sixth aperture K6 can be a concave aperture above the third channel B3, and can be a fully closed or semi-closed aperture defined above the third channel B3. The third source electrode tip region S31 refers to an end portion region of the third source electrode S3, and the end portion region is a region formed by the end portion of the third source electrode S3 extending for a certain distance along the third source electrode S3.

The present embodiment defines the sixth aperture K6 above the third channel B3, and disposes the third source electrode tip region S31 to correspond to the sixth aperture K6 such that the third source electrode tip region S31 does not overlap with third channel B3 to eliminate a risk that electric charges are accumulated in the third source electrode tip region S31 to result in the third channel B3 to be struck through, which further improves reliability of the voltage divider transistor T3.

Figure 3:
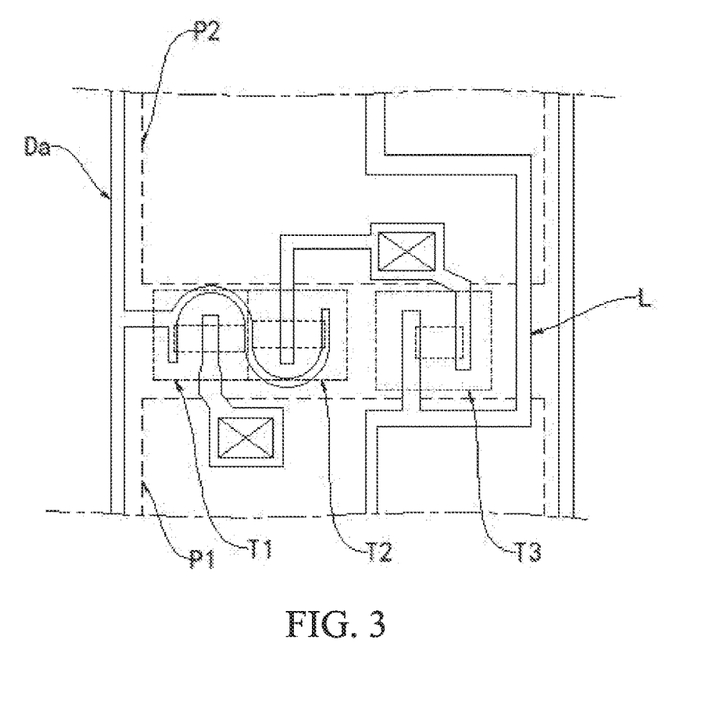
FIG. 3 is a partial perspective view of a second display panel provided by the embodiment of the present application.
Figure 4:
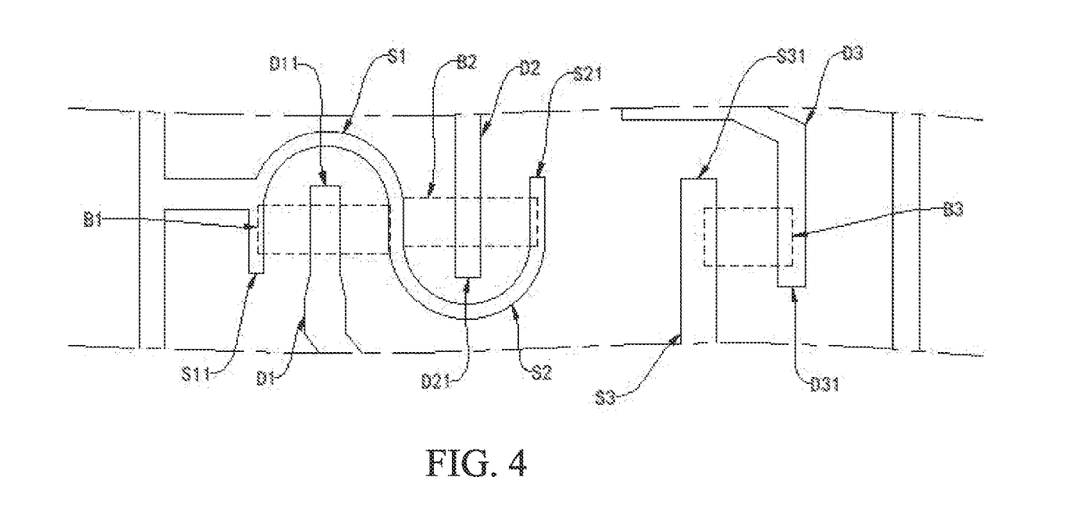
FIG. 4 is a schematic partial view of a region of the display panel shown in FIG. 3 in which a transistor is correspondingly located.

In an embodiment, with reference to FIGS. 3 and 4, FIG. 3 is a partial perspective view of a second display panel provided by the embodiment of the present application, and FIG. 4 is a schematic partial view of a region of the display panel shown in FIG. 3 in which a transistor is correspondingly located. FIGS. 3 and 1 have the same or similar structures, structures and features of the display panel as shown in FIG. 3 are described as follows, and the unspecified thereof refers to relative descriptions of the above relative descriptions about the display panel as shown in FIG. 1.

In the present embodiment, the display panel comprises a driver circuit layer and a pixel electrode disposed on the driver circuit layer. The pixel electrode comprises a main pixel electrode P1 and an auxiliary pixel electrode P2. The main pixel electrode P1 and the auxiliary pixel electrode P2 generate different electrical field effects such that the display panel has a greater viewable angle.

The driver circuit layer comprises a main transistor T1, an auxiliary transistor T2, and a voltage divider transistor T3. The driver circuit layer further comprises a semiconductor layer and an electrode layer.

The main transistor T1 comprises a first channel B1 located on the semiconductor layer and a first source electrode S1 and a first drain electrode D1 located on the electrode layer.

A first end of the first channel B1 is connected to the first drain electrode D1, ad a second end of the first channel B1 is connected to the first source electrode S1. The first drain electrode D1 is electrically connected to the main pixel electrode P1, and the first source electrode S1 is electrically connected to data line Da.

The first drain electrode D1 comprises a first drain electrode tip region D11, and an orthographic projection of the first drain electrode tip region D11 on the semiconductor layer is located outside the first channel B1. Namely, the first drain electrode tip region D11 does not overlap with the first channel B1, an arrangement region of the first channel B1 extends out from a region within a certain rang of an end portion of the first drain electrode D1 such that no semiconductor material exists in a region in which the first drain electrode tip region D11 is located to eliminate a risk that the first channel B1 is struck through by electric charges accumulated in the first drain electrode tip region D11, which improves reliability of main transistor T1.

Furthermore, the first source electrode S1 comprises a first source electrode tip region S11, an orthographic projection of the first source electrode tip region Si1 on the semiconductor layer is located outside the first channel B1. Namely, the first source electrode tip region S11 does not overlap with the first channel B1, and an arrangement region of the first channel B1 extends out from a region within a certain range of an end portion of the first source electrode S1 such that no semiconductor material exists in a region in which the first source electrode tip region S11 is located to eliminate a risk that the first channel B1 is struck through by electric charges accumulated in the first source electrode tip region Sit which further improves reliability of the main transistor T1.

Furthermore, a shape of a projection of the first semiconductor B1 on the semiconductor layer is rectangular, and a projection of the first drain electrode tip region Di1 and the first source electrode tip region S11 on the semiconductor layer are located outside the first channel B1.

Furthermore, the auxiliary transistor T2 comprises a second channel B2 located on the semiconductor layer and a second source electrode S2 and a second drain electrode D2 located on the electrode layer.

A first end of the second channel B2 is connected to the second drain electrode D2, and a second end of the second channel B2 is connected to the second source electrode S2. The second drain electrode D2 is electrically connected to the auxiliary pixel electrode P2, and the second source electrode S2 is electrically connected to data line Da.

Optionally, the first source electrode S1 and the second source electrode S2 are electrically connected to, and both are connected to the data line Da.

The second drain electrode D2 comprises a second drain electrode tip region D21, an orthographic projection of the second drain electrode tip region D21 on the semiconductor layer is located outside the second channel B2. Namely, the second drain electrode tip region D21 dose not overlap with the second channel B2, an arrangement region of the second channel B2 extends out from a region within a certain range of an end portion of the second drain electrode D2 such that no semiconductor material exists in a region in which the second drain electrode tip region D21 is located to eliminate a risk that the second channel B2 is struck through by electric charges accumulated in the second drain electrode tip region D21, which improves reliability of auxiliary transistor T2.

Furthermore, the second source electrode S2 comprises a second source electrode tip region S21, and an orthographic projection of the second source electrode tip region S21 the semiconductor layer is located outside the second channel B2. Namely, the second source electrode tip region S21 does not overlap with the second channel B2. An arrangement region of the second channel B2 extends out from a region within a certain range of an end portion of the second source electrode S2 such that no semiconductor material exists in a region in which the second source electrode tip region S21 is located to eliminate a risk that the second channel B2 is struck through by electric charges accumulated in the second source electrode tip region S21, which improve reliability of the auxiliary transistor T2.

Furthermore, a projection of the second channel B2 on the semiconductor layer is rectangular. A projection of the second drain electrode tip region D21 and the second source electrode tip region S21 on the semiconductor layer is located outside the second channel B2.

Furthermore, the voltage divider transistor T3 comprises a third channel B3 located above the semiconductor layer and a third source electrode S3 and a third drain electrode D3 located on the electrode layer.

A first end of the third channel B3 is connected to the third drain electrode D3, and a second end of the third channel B3 is connected to the third source electrode S3. The third drain electrode D3 is electrically connected to the auxiliary pixel electrode P2, and the third source electrode S3 is electrically connected to common line L. The voltage divider transistor is configured to transmit signals provided by the common line L to the auxiliary pixel electrode P2 to lower intensity of an electrical field generated by the auxiliary pixel electrode P2.

The third drain electrode D3 comprises a third drain electrode tip region D31, and an orthographic projection of the third drain electrode tip region D31 on the semiconductor layer is located outside the third channel B3. Namely, the third drain electrode tip region D31 does not overlap with the third channel B3, an arrangement region of the third channel B3 extends out from a region within a certain range of an end portion of the third drain electrode D3 such that no semiconductor material exists in a region in which the third drain electrode tip region D31 is located to eliminate a risk that the third channel B3 is struck through by electric charges accumulated in the third drain electrode tip region D31, which improves reliability of the voltage divider transistor T3.

Furthermore, the third source electrode S3 comprises a third source electrode tip region S31, and an orthographic projection of the third source electrode tip region S31 on the semiconductor layer is located outside the third channel B3. Namely, the third source electrode tip region S31 does not overlap with the third channel B3, and an arrangement region of the third channel B3 extends out from a region within a certain range of an end portion the third source electrode S3 such that no semiconductor material exists in a region in which the third source electrode tip region S31 is located in to eliminate a risk that the third channel B3 is struck through by electric charges accumulated in the third source electrode tip region S31, which further improves reliability of voltage divider transistor T3.

Furthermore, a shape of a projection of the third channel B3 on the semiconductor layer is rectangular, and a projection of the third drain electrode tip region D31 and the third source electrode tip region S31 on the semiconductor layer is located outside the third channel B3.

Figure 5:
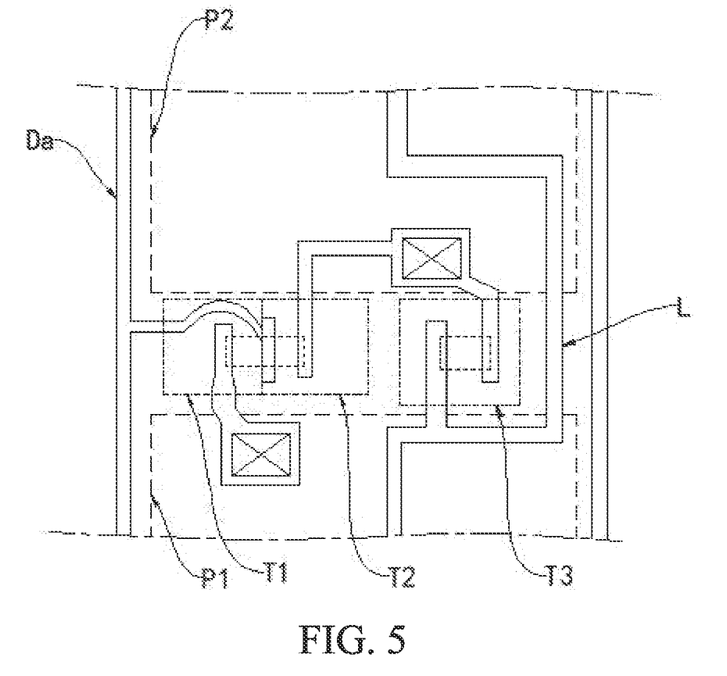
FIG. 5 is a partial perspective view of a third display panel provided by the embodiment of the present application.
Figure 6:
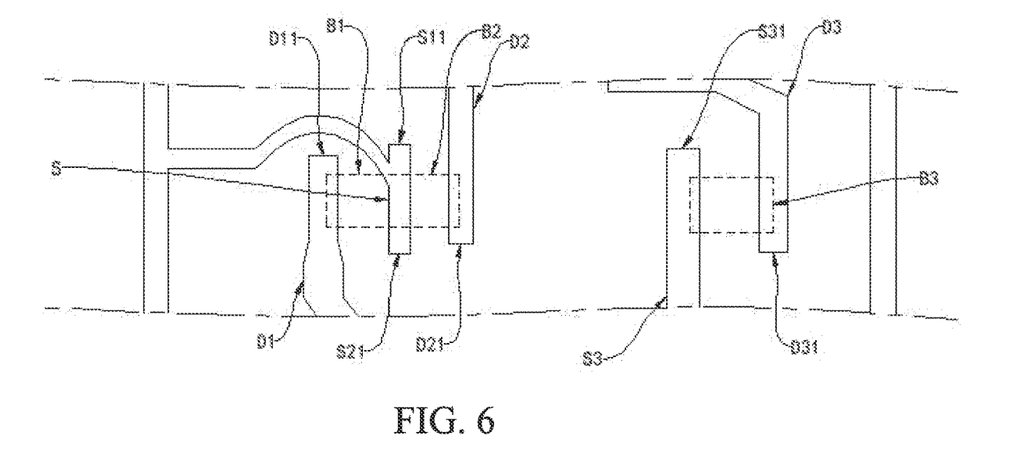
FIG. 6 is a schematic partial view of a region of the display panel shown in FIG. 5 in which a transistor is correspondingly located.

In an embodiment, with reference to FIGS. 5 and 6, FIG. 5 is a partial perspective view of a third display panel provided by the embodiment of the present application, and FIG. 6 is a schematic partial view of a region of the display panel shown in FIG. 5 in which a transistor is correspondingly located. The display panel as shown in FIG. 5 and the display panels as shown in FIGS. 1 and 3 have the same or similar structures, structures and features of the display panel as shown in FIG. 5 are described as follows, and the unspecified thereof refers to relative descriptions of the above embodiment.

In the present embodiment, the display panel comprises a driver circuit layer and a pixel electrode disposed on the driver circuit layer, the pixel electrode comprises a main pixel electrode P1 and an auxiliary pixel electrode P2, the main pixel electrode P1 and the auxiliary pixel electrode P2 generate different electrical fields such that the display panel has a greater viewable angle.

The driver circuit layer comprises a main transistor T1, an auxiliary transistor T2, and a voltage divider transistor T3, and the driver circuit layer further comprises a semiconductor layer and an electrode layer.

The main transistor T1 comprises a first channel B1 located on the semiconductor layer and a common source electrode S and a first drain electrode D1 located on the electrode layer. The auxiliary transistor T2 comprises a second channel B2 located on the semiconductor layer and and a common source electrode S and a second drain electrode D2 located on the electrode layer.

A first end of the first channel B1 is connected to first drain electrode D1, a first end of the second channel B2 is connected to second drain electrode D2, a second end of the first channel B1 and a second end of the second channel B2 are commonly connected to common source electrode S. the first drain electrode D1 is electrically connected to the main pixel electrode P1, the second drain electrode D2 is electrically connected to the auxiliary pixel electrode P2, the common source electrode S is electrically connected to data line Da.

The first drain electrode D1 comprises a first drain electrode tip region D11, and an orthographic projection of the first drain electrode tip region D11 on the semiconductor layer is located outside the first channel B1. Namely, the first drain electrode tip region D11 does not overlap with the first channel B1, an arrangement region of the first channel B1 extends out from a region within a certain rang of an end portion of the first drain electrode D1 such that no semiconductor material exists in a region in which the first drain electrode tip region D11 is located to eliminate a risk that the first channel B1 is struck through by electric charges accumulated in the first drain electrode tip region D11, which improves reliability of main transistor T1.

The second drain electrode D2 comprises a second drain electrode tip region D21, and an orthographic projection of the second drain electrode tip region D21 on the semiconductor layer is located outside the second channel B2. Namely, the second drain electrode tip region D21 does not overlap with the second channel B2, and an arrangement region of the second channel B2 extends out from a region within a certain range of the second drain electrode D2 such that no semiconductor material exists in a region in which the second drain electrode tip region D21 is located to eliminate a risk that the second channel B2 is struck through by electric charges accumulated in second drain electrode tip region D21, which improves reliability of the auxiliary transistor T2.

Furthermore, the common source electrode S comprises a first source electrode tip region S11 and a second source electrode tip region S21, the first source electrode tip region S11 and the second source electrode tip region S21 are located at two opposite ends of the common source electrode S respectively.

An orthographic projection of the first source electrode tip region S11 on the semiconductor layer and an orthographic projection of the second source electrode tip region S21 on the semiconductor layer are located outside the first channel B1 and the second channel B2. The above design of the present embodiment makes no semiconductor material exist in a region in which the first source electrode tip region S11 is located and a region in which the second source electrode tip region S21 is located to eliminate a risk that the first channel B1 and/or the second channel B2 are struck through by electric charges accumulated in the first source electrode tip region S11 or electric charges accumulated in the second source electrode tip region S21, which further improves reliability of the main transistor T1 and the auxiliary transistor T2.

Furthermore, shapes of projections of the first channel B1 and the second channel B2 on the semiconductor layer are rectangular, the first drain electrode tip region D11, projections of the second drain electrode tip region D21, the first source electrode tip region Sit and the second source electrode tip region S21 on the semiconductor layer are located outside the first channel B1 and the second channel B2.

Furthermore, the voltage divider transistor T3 comprises a third channel B3 located above the semiconductor layer and a third source electrode S3 and a third drain electrode D3 located on the electrode layer.

A first end of the third channel B3 is connected to the third drain electrode D3, and a second end of the third channel B3 is connected to the third source electrode S3. The third drain electrode D3 is electrically connected to the auxiliary pixel electrode P2, and the third source electrode S3 is electrically connected to common line L. The voltage divider transistor is configured to transmit signals provided by the common line L to the auxiliary pixel electrode P2 to lower intensity of an electrical field generated by the auxiliary pixel electrode P2.

The third drain electrode D3 comprises a third drain electrode tip region D31, and an orthographic projection of the third drain electrode tip region D31 on the semiconductor layer is located outside the third channel B3. Namely, the third drain electrode tip region D31 does not overlap with the third channel B3, an arrangement region of the third channel B3 extends out from a region within a certain range of an end portion of the third drain electrode D3 such that no semiconductor material exists in a region in which the third drain electrode tip region D31 is located to eliminate a risk that the third channel B3 is struck through by electric charges accumulated in the third drain electrode tip region D31, which improves reliability of the voltage divider transistor T3.

Furthermore, the third source electrode S3 comprises a third source electrode tip region S31, and an orthographic projection of the third source electrode tip region S31 on the semiconductor layer is located outside the third channel B3. Namely, the third source electrode tip region S31 does not overlap with the third channel B3, and an arrangement region of the third channel B3 extends out from a region within a certain range of an end portion the third source electrode S3 such that no semiconductor material exists in a region in which the third source electrode tip region S31 is located in to eliminate a risk that the third channel B3 is struck through by electric charges accumulated in the third source electrode tip region S31, which further improves reliability of voltage divider transistor T3.

Furthermore, a shaped of a projection of the third channel B3 on the semiconductor layer is rectangular, and a projection of the third drain electrode tip region D31 and the third source electrode tip region S31 on the semiconductor layer is located outside the third channel B3.

Figure 7:
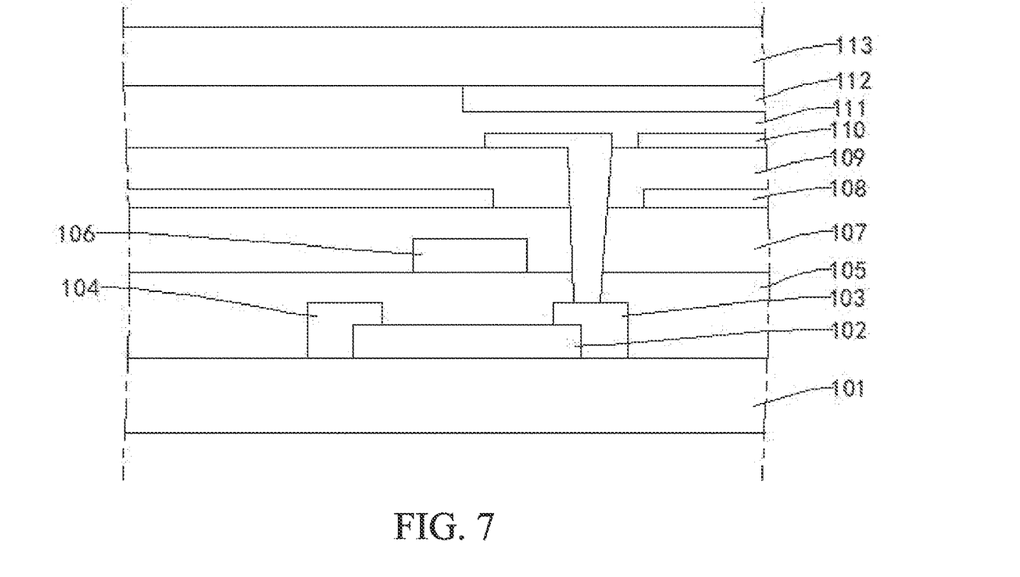
FIG. 7 is a first schematic structural view in partial section of the display panel provided by the embodiment of the present application.

In an embodiment, with reference to FIG. 7, FIG. 7 is a first schematic structural view in partial section of the display panel provided by the embodiment of the present application.

The display panel comprises an underlay substrate 101 and a driver circuit layer disposed on the underlay substrate 101. The driver circuit layer comprises: a channel 102 defined in the underlay substrate 101, a source electrode 104 and a drain electrode 103 disposed on two opposite ends of the channel 102, a gate electrode insulation layer 105 covering the channel 102, the source electrode 104 and the drain electrode 103, a gate electrode 106 disposed on the gate electrode insulation layer 105, and an interlayer dielectric layer 107 covering the gate electrode 106. The channel 102 can be equivalent to the first channel, the second channel, or the third channel as described in the above embodiment. The source electrode 104 can be equivalent to first source electrode, second source electrode, third source electrode, or common source electrode as described in the above embodiment. The drain electrode 103 can be equivalent to the first drain electrode, the second drain electrode, or the third drain electrode as described in the above embodiment.

The display panel further comprises: a common electrode 108 disposed on the driver circuit layer, a passivation layer 109 covering the common electrode 108, a pixel electrode 110 disposed on the passivation layer 109, a liquid crystal layer 111 located on the pixel electrode 110, a color resist layer 112 located on the liquid crystal layer 111, and a substrate 113 located on the color resist layer 112. The pixel electrode 110 can be equivalent to the main pixel electrode or the auxiliary pixel electrode described in the above embodiment.

Figure 8:
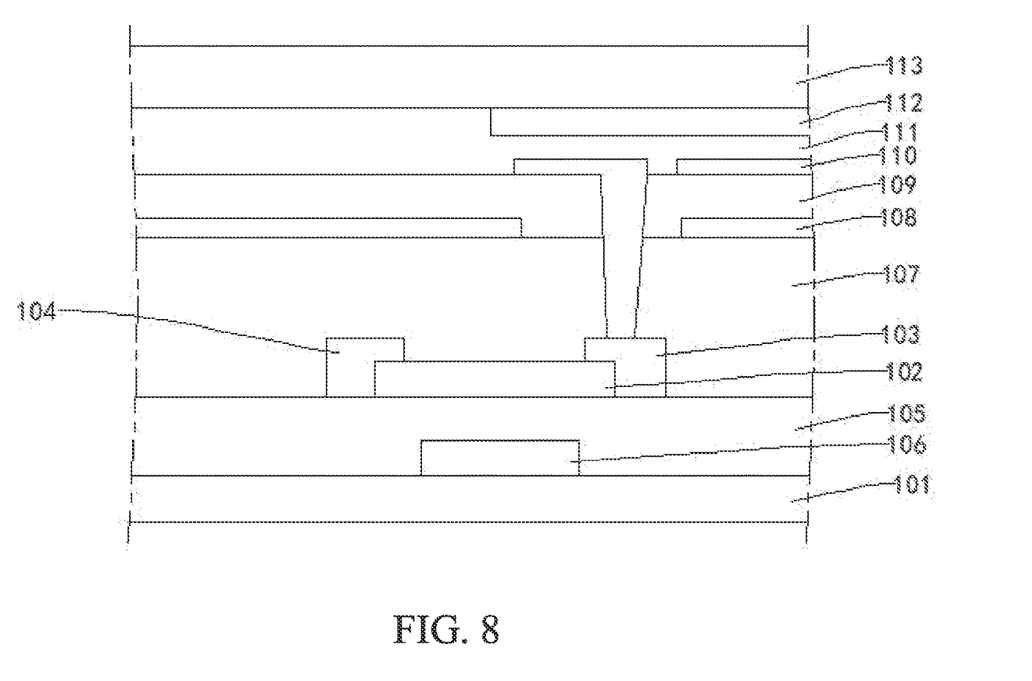
FIG. 8 is a second schematic structural view in partial section of the display panel provided by the embodiment of the present application.

In an embodiment, with reference to FIG. 8, FIG. 8 is a second schematic structural view in partial section of the display panel provided by the embodiment of the present application.

The display panel comprises an underlay substrate 101 and a driver circuit layer disposed on the underlay substrate 101. The driver circuit layer comprises: a gate electrode 106 disposed on the underlay substrate 101, a gate electrode insulation layer 105 covering the gate electrode 106, a channel 102 defined in the gate electrode insulation layer 105, a source electrode 104, a drain electrode 103, and a interlayer dielectric layer 107 covering the channel 102, the source electrode 104, and the drain electrode 103. The channel 102 can be equivalent to the first channel, second channel, or third channel described in the above embodiment. the source electrode 104 can be equivalent to the first source electrode, the second source electrode, the third source electrode, or common source electrode described in the above embodiment. The drain electrode 103 can be equivalent to the first drain electrode, the second drain electrode, or the third drain electrode described in the above embodiment.

The display panel further comprises: a common electrode 108 disposed on the driver circuit layer, a passivation layer 109 covering the common electrode 108, a pixel electrode 110 disposed on the passivation layer 109, a liquid crystal layer 111 located on the pixel electrode 110, a color resist layer 112 located on the liquid crystal layer 111, and a substrate 113 located on the color resist layer 112. The pixel electrode 110 can be equivalent to the main pixel electrode or the auxiliary pixel electrode described in the above embodiment.

The embodiment of the present application also provides a display device, the display device comprises the display panel provided by embodiment of the present application. the display device can be an instrument having an image display function such as laptop, tablet, cell phone, computer monitor, television, navigator.

It should be explained that although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A display panel, comprising transistors in a display region, the transistors comprising a main transistor, an auxiliary transistor, and a voltage divider transistor, and the transistors comprising a channel located above a semiconductor layer and a source electrode and a drain electrode located on an electrode layer;
   wherein the drain electrode comprises a drain electrode tip region, and an orthographic projection of the drain electrode tip region on the semiconductor layer is located outside the channel;
   wherein the source electrode comprises a source electrode tip region, and an orthographic projection of the source electrode tip region on the semiconductor layer is located outside the channel;
   wherein the transistors comprise the main transistor, the main transistor comprises a first channel located in the semiconductor layer and a first source electrode and a first drain electrode located on the electrode layer;
   wherein the first drain electrode comprises a first drain electrode tip region, and an orthographic projection of the first drain electrode tip region on the semiconductor layer is located outside the first channel;
   wherein the first source electrode comprises a first source electrode tip region, and an orthographic projection of the first source electrode tip region on the semiconductor layer is located outside the first channel;
   wherein the first channel comprises a first aperture, and the orthographic projection of the first drain electrode tip region on the semiconductor layer is located in the first aperture.

2. The display panel according to claim 1, wherein the first channel comprises a second aperture, and the orthographic projection of the first source electrode tip region on the semiconductor layer is located in the second aperture.

3. The display panel according to claim 2, wherein the first aperture is a concave aperture, or is a fully closed or semi-closed aperture; and
the second aperture is a concave aperture or, is a fully closed or semi-closed aperture.

4. The display panel according to claim 1, wherein the auxiliary transistor comprises a second channel located in the semiconductor layer and a second source electrode and a second drain electrode located on the electrode layer; and
the second drain electrode comprises a second drain electrode tip region, and an orthographic projection of the second drain electrode tip region on the semiconductor layer is located outside the second channel.

5. The display panel according to claim 4, wherein the second source electrode comprises a second source electrode tip region, and an orthographic projection of the second source electrode tip region on the semiconductor layer is located outside the second channel.

6. The display panel according to claim 5, wherein the second channel comprises a third aperture, the orthographic projection of the second drain electrode tip region on the semiconductor layer is located in the third aperture.

7. The display panel according to claim 6, wherein the second channel comprises a fourth aperture, and the orthographic projection of the second source electrode tip region on the semiconductor layer is located in the fourth aperture.

8. The display panel according to claim 7, wherein the third aperture is a concave aperture, or is a fully closed or semi-closed aperture; and
the fourth aperture is a concave aperture, or is a fully closed or semi-closed aperture.

9. The display panel according to claim 1, wherein the voltage divider transistor comprises a third channel located in the semiconductor layer and a third source electrode and a third drain electrode located on the electrode layer; and
the third drain electrode comprises a third drain electrode tip region, and an orthographic projection of the third drain electrode tip region on the semiconductor layer is located outside the third channel.

10. The display panel according to claim 9, wherein the third source electrode comprises a third source electrode tip region, and an orthographic projection of the third source electrode tip region on the semiconductor layer is located outside the third channel.

11. The display panel according to claim 10, wherein the third channel comprises a fifth aperture, and an orthographic projection of the third drain electrode tip region on the semiconductor layer is located in the fifth aperture.

12. The display panel according to claim 11, wherein the third channel comprises a sixth aperture, and an orthographic projection of the third source electrode tip region on the semiconductor layer is located in the sixth aperture.

13. The display panel according to claim 12, wherein the fifth aperture is a concave aperture, or is a fully closed or semi-closed aperture; and
the sixth aperture is a concave aperture, or is a fully closed or semi-closed aperture.

14. The display panel according to claim 9, wherein the display panel further comprises a main pixel electrode and an auxiliary pixel electrode, the main transistor is electrically connected to the main pixel electrode, and the auxiliary transistor and the voltage divider transistor are electrically connected to the auxiliary pixel electrode.

15. A display device, comprising the display panel according to claim 1.

16. A display panel, comprising a main transistor, an auxiliary transistor, and a voltage divider transistor;
wherein the main transistor comprises a first channel located in a semiconductor layer and a first source electrode and a first drain electrode located on an electrode layer, the first drain electrode comprises a first drain electrode tip region, an orthographic projection of the first drain electrode tip region on the semiconductor layer is located outside the first channel, the first source electrode comprises a first source electrode tip region, and an orthographic projection of the first source electrode tip region on the semiconductor layer is located outside the first channel;
wherein the auxiliary transistor comprises a second channel located in the semiconductor layer and a second source electrode and a second drain electrode located on the electrode layer, the second drain electrode comprises a second drain electrode tip region, an orthographic projection of the second drain electrode tip region on the semiconductor layer is located outside the second channel, the second source electrode comprises a second source electrode tip region, and an orthographic projection of the second source electrode tip region on the semiconductor layer is located outside the second channel; and
wherein the voltage divider transistor comprises a third channel located in the semiconductor layer and a third source electrode and a third drain electrode located on the electrode layer, the third drain electrode comprises a third drain electrode tip region, an orthographic projection of the third drain electrode tip region on the semiconductor layer is located outside the third channel, the third source electrode comprises a third source electrode tip region, and an orthographic projection of the third source electrode tip region on the semiconductor layer is located outside the third channel.

* * * * *